United States Patent
Huang et al.

(10) Patent No.: US 10,447,436 B2
(45) Date of Patent: Oct. 15, 2019

(54) POLAR CODE GENERATING METHOD, AND ELECTRONIC DEVICE AND NON-TRANSITORY COMPUTER-READABLE STORAGE MEDIUM THEREFOR

(71) Applicant: MACRONIX INTERNATIONAL CO., LTD., Hsinchu (TW)

(72) Inventors: Yu-Ming Huang, Taipei (TW); Chih-Huai Shih, Taichung (TW); Hsiang-Pang Li, Zhubei (TW); Hsi-Chia Chang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 59 days.

(21) Appl. No.: 15/890,500

(22) Filed: Feb. 7, 2018

(65) Prior Publication Data

US 2019/0245653 A1    Aug. 8, 2019

(51) Int. Cl.
*H04L 1/00* (2006.01)
*H03M 13/00* (2006.01)
*H03M 13/13* (2006.01)

(52) U.S. Cl.
CPC .......... *H04L 1/0058* (2013.01); *H03M 13/13* (2013.01); *H03M 13/616* (2013.01)

(58) Field of Classification Search
CPC .... H04L 1/0058; H03M 13/13; H03M 13/616
USPC ................................................. 714/776, 799
See application file for complete search history.

(56) References Cited

U.S. PATENT DOCUMENTS

| | | | | |
|---|---|---|---|---|
| 9,467,253 | B2* | 10/2016 | Mahdavifar | H04L 1/0075 |
| 9,628,114 | B2* | 4/2017 | Huang | H03M 13/13 |
| 9,742,440 | B2* | 8/2017 | El-Khamy | H03M 13/6368 |
| 10,069,510 | B2* | 9/2018 | Feygin | H03M 7/30 |
| 10,128,982 | B2* | 11/2018 | Huang | H04L 1/0058 |
| 2015/0295593 | A1* | 10/2015 | Trifonov | H03M 13/3746 714/776 |
| 2016/0204811 | A1* | 7/2016 | Goela | H04B 1/123 375/260 |
| 2016/0285479 | A1* | 9/2016 | El-Khamy | H03M 13/6368 |

(Continued)

OTHER PUBLICATIONS

Abbe et al., Polar Codes for the -User Multiple Access Channel, Aug. 2012, IEEE, vol. 58, No. 8, pp. 5437-5448. (Year: 2012).*

(Continued)

*Primary Examiner* — John J Tabone, Jr.
(74) *Attorney, Agent, or Firm* — McClure, Qualey & Rodack, LLP

(57) ABSTRACT

A method for generating a polar code includes the steps of: establishing a plurality of polarization matrices that receive a plurality of first input bits via a plurality of first input channels and provide a plurality of first output bits on a plurality of first output channels; selecting at least one to-be-enhanced input channel from the first input channels of the polarization matrices; providing a re-polarization matrix that receives a plurality of second input bits via a plurality of second input channels and provides a plurality of second output bits on a plurality of second output channels, wherein a part of the second output bits is used as the first output bit(s) on the at least one to-be-enhanced input channel; and providing a polar code that comprises the first output bits and a remaining part of the second output bits.

15 Claims, 7 Drawing Sheets

(56) References Cited

U.S. PATENT DOCUMENTS

| | | | | |
|---|---|---|---|---|
| 2016/0294418 A1* | 10/2016 | Huang | .................. | H03M 13/13 |
| 2017/0222757 A1* | 8/2017 | Huang | .................. | H04L 1/0058 |
| 2018/0145702 A1* | 5/2018 | Feygin | .................... | H03M 7/30 |
| 2018/0323905 A1* | 11/2018 | Shelby | ................ | H03M 13/033 |
| 2018/0351693 A1* | 12/2018 | Jang | ...................... | H03M 13/13 |
| 2018/0375526 A1* | 12/2018 | Feygin | .................... | H03M 7/30 |
| 2019/0028241 A1* | 1/2019 | Ahn | ...................... | H04L 1/0057 |
| 2019/0132005 A1* | 5/2019 | Chen | .................... | H03M 13/13 |
| 2019/0140767 A1* | 5/2019 | Chen | .................... | H04L 1/0009 |

OTHER PUBLICATIONS

Arikan, Channel Polarization: A Method for Constructing Capacity-Achieving Codes for Symmetric Binary-Input Memoryless Channels, Jul. 2009, IEEE, vol. 55, No. 7, pp. 3051-3073. (Year: 2009).*
Guasoni et al., All-Optical Signal Processing Based on Self-Induced Polarization Control in Optical Fibers, Jan. 15, 2016, IEEE, vol. 34, No. 2, pp. 327-341. (Year: 2016).*
Sasoglu et al., Polar codes for the two-user binary-input multiple-access channel, 2009, IEEE, pp. 1-5. (Year: 2009).*
TIPO Office Action dated Nov. 29, 2018 in Taiwan application (No. 107104653).

* cited by examiner

POLAR CODE GENERATING METHOD, AND ELECTRONIC DEVICE AND NON-TRANSITORY COMPUTER-READABLE STORAGE MEDIUM THEREFOR

TECHNICAL FIELD

The disclosure relates to a polar code generating method, and an electronic device and a non-transitory computer-readable storage medium using the same.

BACKGROUND

Polar code is an advanced error correcting code. The coding scheme of polar code mainly uses a polar matrix to polarize input bit channels into relatively reliable bit channels and relatively unreliable bit channels. The reliable bit channels are used to transfer information bits, while the unreliable bit channels are used to transfer frozen bits. If a polar code has a sufficiently long code length (chunk size), information bits are guaranteed to be transmitted perfectly. In other words, the error rate tends to 0 as code length increases.

Currently, the code length of polar code is often restricted to the power of 2, resulting in an increase in system complexity. In addition, the reliability of input bit channels is highly influenced by the states of output channels of the polar transformation. Once the output channel changes, even with the same polarization matrix, the ranking of the reliability of the input bit channels will change. Once the unreliable bit channel is misused to transmit information bits, the performance of error correction is reduced.

SUMMARY

The disclosure relates to a polar code generating method, and an electronic device and a non-transitory computer-readable storage medium using the same. According to the embodiments of the present disclosure, the processor may establish a plurality of polarization matrices and perform repolarization on specific input bit channel(s) of the polarization matrices to improve the channel reliability. Further, the code length of the present disclosure is not restricted to the power of 2 due to the re-polarization processing, thereby reducing the complexity of system design.

According to an embodiment, a polar code generating method is provided. The polar code generating method can be executed by an electronic device including a processor, and includes the following steps. A plurality of polarization matrices that receive a plurality of first input bits via a plurality of first input channels are established. The polarization matrices perform a first polar coding scheme on the first input bits and provide a plurality of first output bits on a plurality of first output channels. At least one to-be-enhanced input channel is selected from the first input channels of the polarization matrices. A re-polarization matrix that receives a plurality of second input bits via a plurality of second input channels is provided. The re-polarization matrix performs a second polar coding scheme on the second input bits and provides a plurality of second output bits on a plurality of second output channels, wherein a part of the second output bits is used as the first output bit(s) on the at least one to-be-enhanced input channel. A polar code that includes the first output bits and a remaining part of the second output bits is provided.

According to an embodiment, a non-transitory computer-readable storage medium is provided. The non-transitory computer-readable storage medium stores one or more instructions executable by a processor to cause an electronic device including the processor perform the following steps. A plurality of polarization matrices that receive a plurality of first input bits via a plurality of first input channels are established. The polarization matrices perform a first polar coding scheme on the first input bits and provide a plurality of first output bits on a plurality of first output channels. At least one to-be-enhanced input channel is selected from the first input channels of the polarization matrices. A re-polarization matrix that receives a plurality of second input bits via a plurality of second input channels is provided. The re-polarization matrix performs a second polar coding scheme on the second input bits and provides a plurality of second output bits on a plurality of second output channels, wherein a part of the second output bits is used as the first output bit(s) on the at least one to-be-enhanced input channel. A polar code that includes the first output bits and a remaining part of the second output bits is provided.

According to an embodiment, an electronic device including a memory and a processor is provided. The memory stores at least one instruction. The processor is coupled to the memory and executes the at least one instruction to implement the following steps. A plurality of polarization matrices that receive a plurality of first input bits via a plurality of first input channels are established. The polarization matrices perform a first polar coding scheme on the first input bits and provide a plurality of first output bits on a plurality of first output channels. At least one to-be-enhanced input channel is selected from the first input channels of the polarization matrices. A re-polarization matrix that receives a plurality of second input bits via a plurality of second input channels is provided. The re-polarization matrix performs a second polar coding scheme on the second input bits and provides a plurality of second output bits on a plurality of second output channels, wherein a part of the second output bits is used as the first output bit(s) on the at least one to-be-enhanced input channel. A polar code that includes the first output bits and a remaining part of the second output bits is provided.

For a better understanding of the above and other aspects of the present disclosure, embodiments are described below in detail with reference to the accompanying drawings:

Figure 1A:
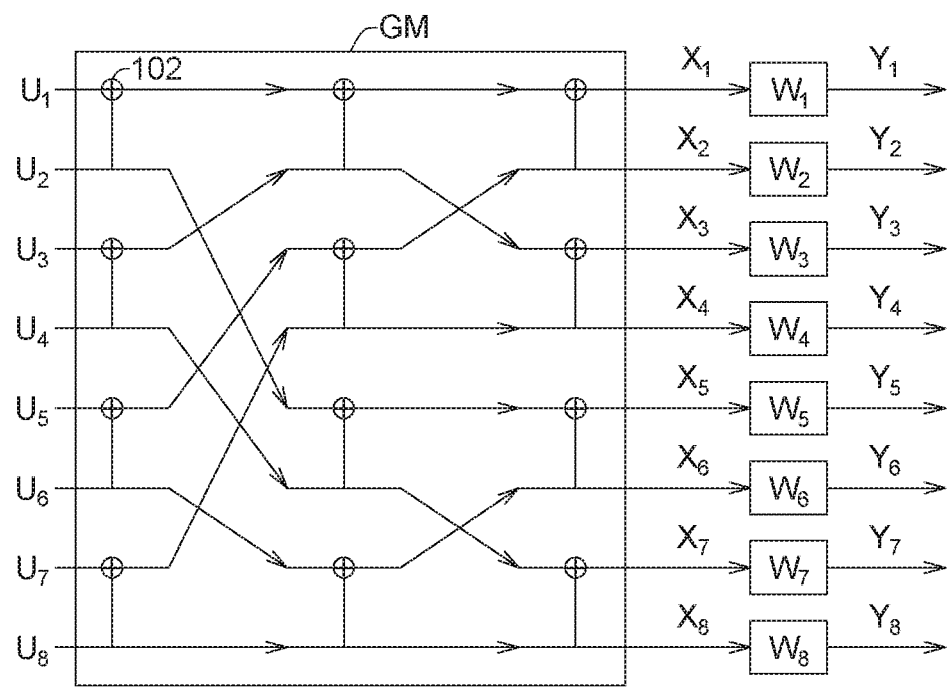
FIG. 1A is a schematic diagram of polarization transformation.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The disclosure provides a polar code generating method, and an electronic device and a non-transitory computer-readable storage medium using the same. The polar code generating method of the present disclosure is executable by an electronic device. For example, the electronic device includes a memory and a processor. The memory stores at least one instruction. The processor is coupled to the memory and may execute the at least one instruction to implement the polar code generating method of the present disclosure. The processor may be, for example, implemented as a microcontroller, a microprocessor, a digital signal processor, an application specific integrated circuit (ASIC), a digital logic circuit, a field programmable gate array (FPGA), or any other hardware element having processing functions. The polar code generating method of the present disclosure may also be implemented as a software program including one or more instructions. The software program may be stored in a non-transitory computer-readable storage medium, such as a hard disk, a compact disc, a flash drive, and a memory. When the processor loads the software program from the non-transitory computer-readable storage medium, the disclosed polar code generating method may be executed.

FIG. 1A is a schematic diagram of polarization transformation. As shown in FIG. 1A, a set of input bits $U_1$ to $U_8$ passes through the polarization matrix GM from the left to the right to form a set of output bits $X_1$ to $X_8$. The input bits $X_1$ to $X_8$ may be written into a set of output channels $W_1$ to $W_8$ as a polar code. In an application of storage devices, each output channel $W_1$ to $W_8$ may be regarded as a memory cell. The output values of the output channels $W_1$ to $W_8$ are $Y_1$ to $Y_8$.

The polarization matrix GM includes a plurality of arithmetic units 102. In the example of FIG. 1A, the polarization matrix GM is formed by three stages of arithmetic units 102 connected in series. With the polarization matrix GM, the input bit channels that receive the input bits $U_1$ to $U_8$ are polarized into reliable input bit channel(s) and unreliable input bit channel(s). With the polarization matrix GM of FIG. 1A, if the output channels $W_1$ to $W_8$ are identical independent distributed (i.i.d.), the input channels that receive the input bits $U_4$, $U_6$, $U_7$ and $U_8$ will be polarized into more reliable channels than the input bit channels that receive the input bits $U_1$, $U_2$, $U_3$, and $U_5$.

Figure 1B:
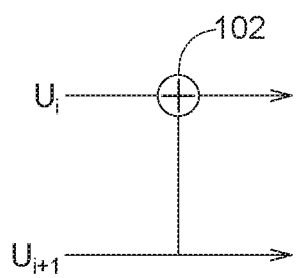
FIG. 1B is a schematic diagram of an arithmetic unit in the polarization matrix.

FIG. 1B is a schematic diagram of an arithmetic unit 102 in the polarization matrix GM. The arithmetic unit 102 may be, for example, an XOR logic gate. With the XOR logic gate, the reliability of the input channel that transmits the input bit $U_{i+1}$ will be enhanced, while the reliability of the input channel that transmits the input bit $U_i$ will be weakened. In other words, the input channel that carries the input bit $U_{i+1}$ will be polarized into a relatively reliable channel compared to the input channel that carries the input bit $U_i$. In the above manner, a polarization matrix that provides arbitrary reliability ranking can be implemented.

Figure 2:
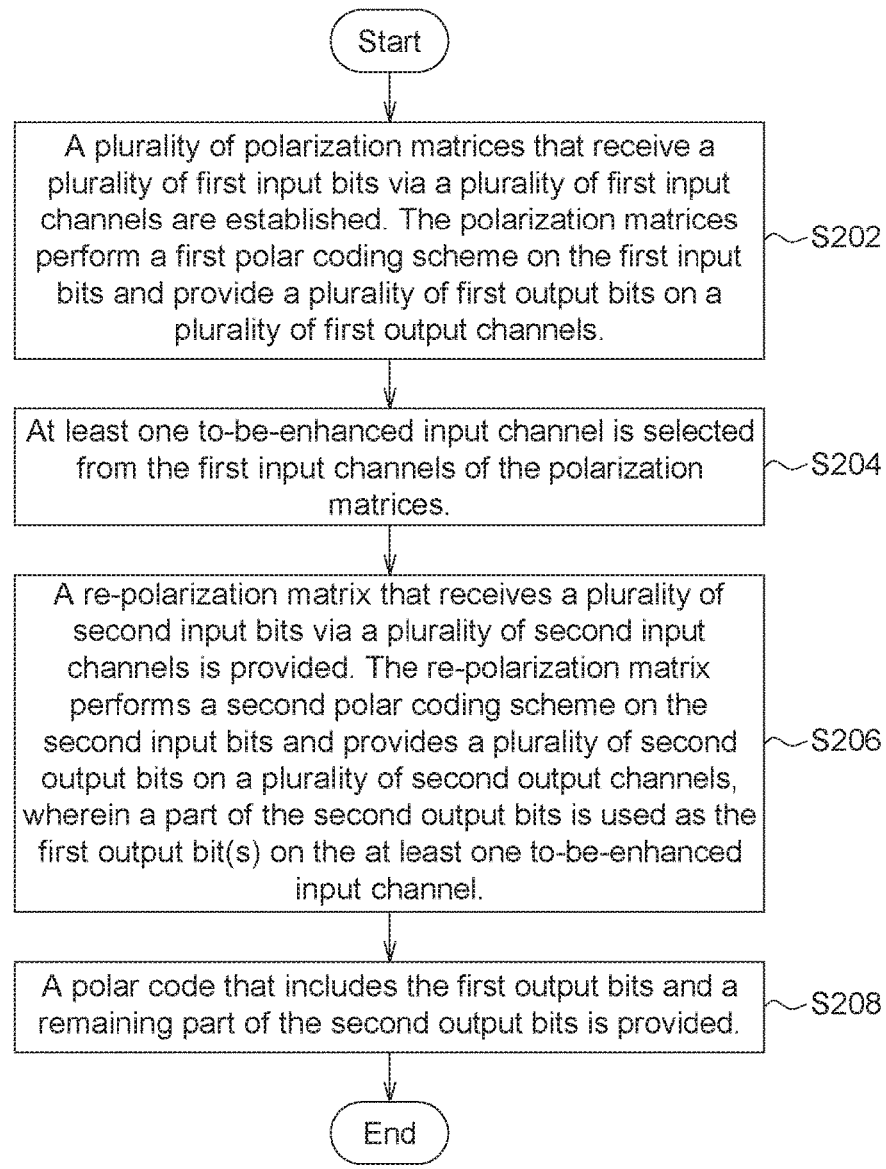
FIG. 2 is a flow chart of a polar code generating method according to an embodiment of the present disclosure.

FIG. 2 is a flow chart of a polar code generating method according to an embodiment of the present disclosure. In step S202, the processor establishes a plurality of polarization matrices. The polarization matrices receive a plurality of first input bits via a plurality of first input channels and perform a first polarization scheme on the first input bits to provide a plurality of first output bits on a plurality of first output channels.

The first polarization scheme may refer to, for example, polarization transformations performed on the first input bits through the respective polarization matrices. The design of each polarization matrix may be arbitrary, and can be implemented with any known polar code construction technique.

In step S204, the processor selects at least one to-be-enhanced input channel from the first input channels of the polarization matrixes. The selected to-be-enhanced input channel(s) will be further re-polarized to improve the channel reliability.

In step S206, the processor provides a re-polarization matrix. The re-polarization matrix may receive a plurality of second input bits via a plurality of second input channels and performs a second polarization scheme on the second input bits to provide a plurality of second output bits on a plurality of second output channels. A part of the second output bits may be used as the first output bit(s) provided on the to-be-enhanced input channel(s).

The second polarization scheme refers to a polarization transformation performed on the second input bits through the re-polarization matrix. The design of the re-polarization matrix may be arbitrary and can be implemented with any known polar code construction technique. A part of the second input channels of the re-polarization matrix may be configured to receive raw data bits corresponding to the to-be-enhanced input channels. The re-polarization matrix may be designed to enhance the reliability of the second input channels receiving the raw data bits. On the other hand, the remaining second input channels which are weakened by the re-polarization matrix may be used to transfer frozen bits.

In step S208, the processor provides a polar code, wherein the polar code includes the first output bits and the remaining part of the second output bits that is not used as the first input bit(s). Because the number of bits of the remaining part of the second output bits may be arbitrary, the code length of the polar code is not limited to the power of 2.

Figure 3:
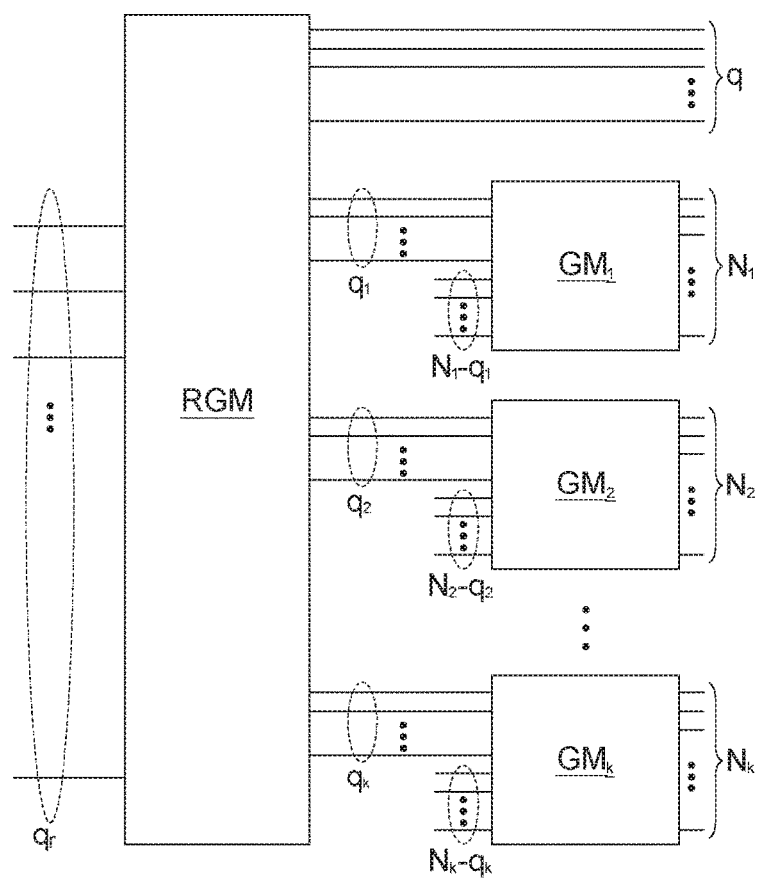
FIG. 3 is a schematic diagram of polarization transformation according to an embodiment of the present disclosure.

FIG. 3 is a schematic diagram of polarization transformation according to an embodiment of the present disclosure. In FIG. 3, the polarization transformation is implemented by k polarization matrices $GM_1$ to $GM_k$ and a re-polarization matrix RGM, where k is a positive integer. The polarization matrices $GM_1$, $GM_2$, ..., $GM_k$ respectively have $N_1$, $N_2$, ..., $N_k$ first input channels (shown on the left side of the polarization matrices $GM_1$ to $GM_k$) and $N_1$, $N_2$, ..., $N_k$ first output channels (shown on the right side of the polarization matrices $GM_1$ to $GM_k$), where $N_1$ to $N_k$ are positive integers. Among $N_1$ first input channel(s) of the polarization matrix $GM_1$, $q_1$ first output channels are selected as the to-be-enhanced input channels and are provided to the re-polarization matrix RGM for re-polarization, while the remaining $N_1-q_1$ first input channels directly receive the raw data bits as the first input bits. Likewise, among the $N_2$ first input channel(s) of the polarization matrix $GM_2$, $q_2$ first output channels are selected as the to-be-enhanced input channels and are provided to the re-polarization matrix RGM for re-polarization, while the remaining $N_2-q_2$ first input channels directly receive the corresponding raw data bits as the first input bits; similarly, among the $N_k$ first input channel(s) of the polarization matrix $GM_k$, the $q_k$ first output channels are selected as the to-be-enhanced input channels and are provided to the re-polarization matrix RGM for re-polarization, while the remaining $N_k-q_k$ first input channels directly receive the raw data bits as the first input bits, where $q_1$ to $q_k$ are non-negative integers.

The re-polarization matrix RGM has $q_r$ second input channels (shown on the left side of the re-polarization matrix RGM) and $q_r$ second output channels (shown on the right side of the re-polarization matrix RGM), where $q_r=q+(q_1+q_2+\ldots+q_k)$. Among the second output bits provided by the re-polarization matrix RGM, a part of the second output bits is provided to the $q_1$ to-be-enhanced channels of the polarization matrix $GM_1$, a part of the second output bits is provided to the $q_2$ to-be-enhanced channels of the polarization matrix $GM_2$, . . . , and a part of the second output bits is provided to the $q_k$ to-be-enhanced channels of the polarization matrix $GM_k$. The number of bits of the remaining part of the second output bits is $q=q_r-(q_1+q_2+\ldots+q_k)$. In an embodiment, the number of bits of the remaining part of the second output bits (q) is the same as the number of channels of the to-be-enhanced input channels $(q_1+q_2+\ldots+q_k)$. At this time, $q_r=2q$, but it is noted that the present disclosure is not limited thereto.

In FIG. 3, the polar code generated from the polarization transformation consists of $N_1+N_2+\ldots+N_k$ first output bits and q second output bits. The q second output bits can be deemed as extra bits generated due to the re-polarization processing.

Figure 4:
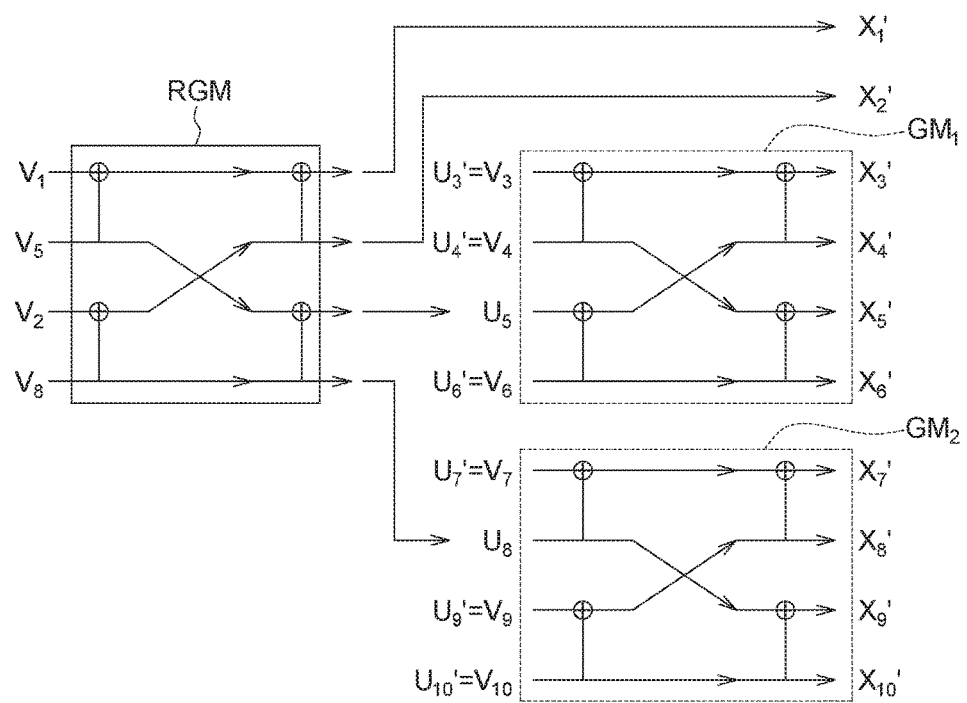
FIG. 4 is a schematic diagram of polarization transformation according to an embodiment of the present disclosure.
Figure 5:
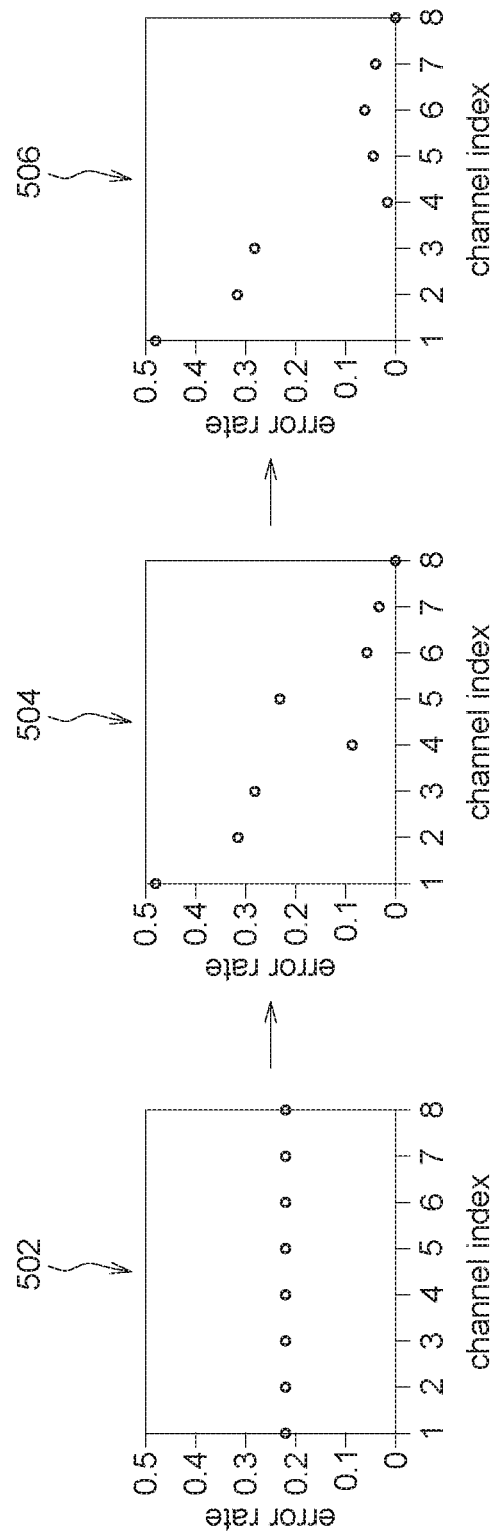
FIG. 5 illustrates channel error rate simulations according to an embodiment of the present disclosure.

For better comprehension, the relevant details are described in conjunction with FIG. 4 and FIG. 5.

FIG. 4 is a schematic diagram of polarization transformation according to an embodiment of the present disclosure. In FIG. 4, the polarization transformation is realized by two polarization matrices $GM_1$ and $GM_2$ and one re-polarization matrix RGM. The polarization matrix $GM_1$ may convert the first input bits $U_3'$ to $U_6'$ into the corresponding first output bits $X_3$ to $X_6$. The polarization matrix $GM_2$ may convert the first input bits $U_7'$ to $U_{10}'$ into the corresponding first output bits $X_7$ to $X_{10}$.

In the example of FIG. 4, the first input channels that transmit the first input bits $U_5$ and $U_8$ are selected as the to-be-enhanced input channels, while the other first output channels transmit the raw data bits. Therefore, except for the first input bits $U_5$ and $U_8$, the other first input bits $U_3$, $U_4$, $U_6$, $U_7$, $U_9$ and $U_{10}$ are raw data bits $V_3$, $V_4$, $V_6$, $V_7$, $V_9$ and $V_{10}$ that has not been processed by the re-polarization matrix RGM.

The two raw date bits $V_5$ and $V_8$ corresponding to the first input bits $U_5$ and $U_8$ and other two raw data bits $V_1$ and $V_2$ are taken as the second input bits provided to the second input channels of the re-polarization matrix RGM. In this embodiment, the re-polarization matrix RGM is implemented by two stages of XOR logic gates, but it should be noted that the disclosure is not limited thereto. The number of stages of the logic gates of the re-polarization matrix RGM may be arbitrary.

The re-polarization matrix RGM has four second output channels, two of which are responsible for providing the first input bits $U_5$ and $U_8$ to the polarization matrices $GM_1$ and $GM_2$, respectively, while the remaining two second output channels are responsible for providing the second output bits $X_1'$ and $X_2'$ which are used a part of the outputted polar code.

Through the re-polarization matrix RGM, the second input channels that transmit the raw data bits $V_5$ and $V_8$ are re-polarized into relatively reliable channels, so that the reliability of the first input channels of the polarization matrices $GM_1$ and $GM_2$ that transmit the first input bits $U_5$ and $U_8$ may be enhanced, and the code length of the polar code may only be increased by two bits (i.e., the two second output bits $X_1'$ and $X_2'$ in this example).

FIG. 5 illustrates channel error rate simulations according to an embodiment of the present disclosure. In the first stage 502, the polarization transformation has not been performed, so the simulated error rates for the eight first input channels with channel indexes 1 to 8 are the same. In the second stage 504, the simulated error rates for the eight first input channels are polarized into different values through a plurality of polarization matrices. Compared with the first channels with channel indexes 1 to 3, the first input channels with channel indexes 4 to 8 are relatively reliable, because they have a lower error rate. In the third stage 506, the first input channels with channel indexes 4 and 5 are selected as the to-be-enhanced input channels for re-polarization, so their error rates are significantly reduced.

According to the disclosed embodiments, different polarization matrices may be configured for different storage units as output channels to provide adaptive polarization transformations. For better comprehension, the relevant details are described in conjunction with FIGS. 6, 7, 8A and 8B.

Figure 6:
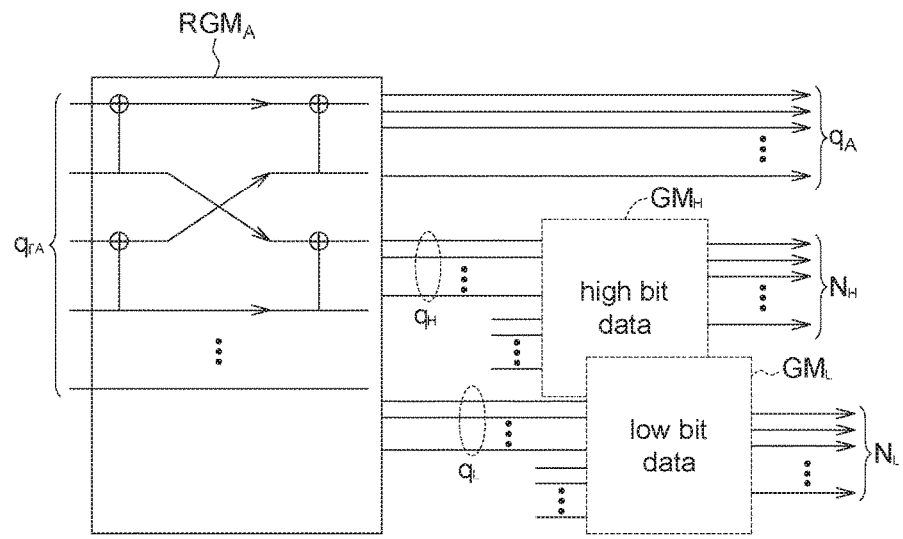
FIG. 6 is a schematic diagram of polarization transformation according to an embodiment of the present disclosure.

FIG. 6 is a schematic diagram of polarization transformation according to an embodiment of the present disclosure. Generally, the channel characteristic of a storage unit for storing MLC high bit information may be different from that for storing MLC low bit information. Applying a single polarization matrix to all the storage units with different channel characteristics may reduce the overall error correcting performance. Therefore, according to the embodiment of FIG. 6, different polarization matrices are set for different MLC logical pages (e.g., high bit data and low bit data). The high bit may refer to, for example, one of the two bits stored in the MLC, and the low bit may refer to the other one of the two bits stored in the MLC. For example, for the 2-bit data "10" stored in the MLC, the high bit may refer to bit "1" (or bit "0" in another example), and the low bit may refer to bit "0" (or bit "1" in another example).

As shown in FIG. 6, the polarization transformation is realized by two polarization matrices $GM_H$ and $GM_L$ and one re-polarization matrix $RGM_A$. The polarization matrix $GM_H$ provides a first group of output bits including $N_H$ first output bits representing the MLC high bit data. The polarization matrix $GM_L$ provides a second group of output bits including $N_L$ first output bits representing the MLC low bit data. The re-polarization matrix $RGM_A$ is implemented by two stages of XOR logic gates. In another embodiment, the number of stages of the logic gates of the re-polarization matrix $RGM_A$ may be arbitrary.

The polarization matrix $GM_H$ and the polarization matrix $GM_L$ respectively have $q_H$ and $q_L$ first input channels selected as the to-be-enhanced input channels. The reliability of the to-be-enhanced input channels may be improved through the re-polarization matrix $RGM_A$, wherein the re-polarization matrix $RGM_A$ includes $q_{rA}$ second input channels, and the number of extra bits in the polar code generated due to the re-polarization matrix $RGM_A$ is $q_A=q_{rA}-(q_H+q_L)$. In an embodiment, $q_{rA}=2q_A$.

Figure 7:
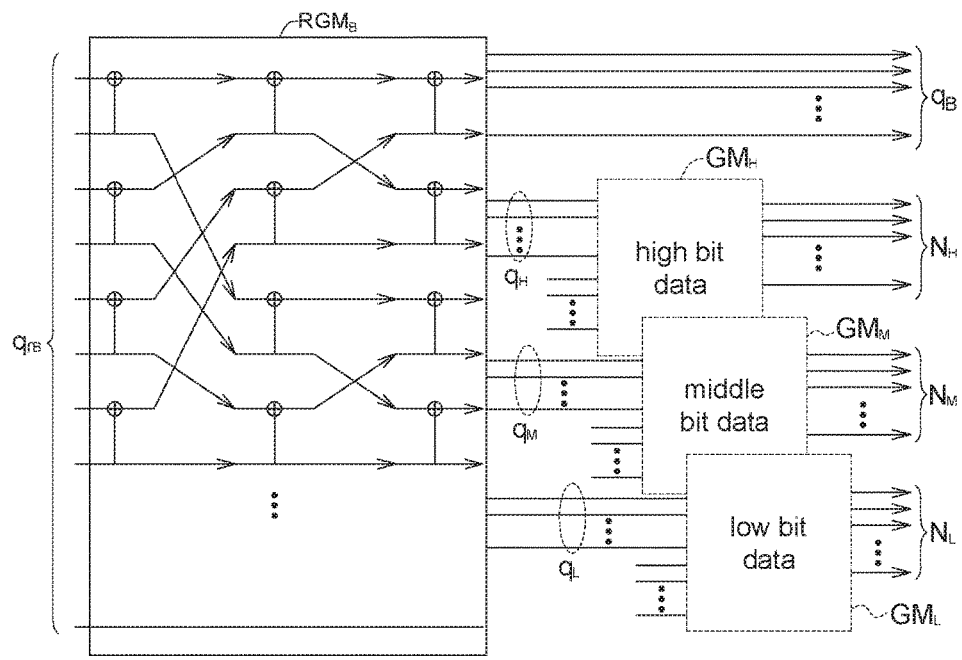
FIG. 7 is a schematic diagram of polarization transformation according to another embodiment of the present disclosure.

FIG. 7 is a schematic diagram of polarization transformation according to another embodiment of the present disclosure. According to the embodiment of FIG. 7, different polarization matrices are set for different triple-level cell (TLC) logical pages (e.g., high bit data, middle bit data and low bit data). The high bit, middle bit, and low bit may respectively represent the three bits in the 3-bit data stored by TLC.

As shown in FIG. 7, the polarization transformation is realized by three polarization matrices $GM_H$, $GM_M$ and $GM_L$ and one re-polarization matrix $RGM_B$. The polarization matrix $GM_H$ provides a first group of output bits including $N_H$ first output bits representing the TLC high bit data. The polarization matrix $GM_M$ provides a second group of output bits including $N_M$ first output bits representing the TLC middle bit data. The polarization matrix $GM_L$ provides a third group of output bits including $N_L$ first output bits representing the TLC low bit data. The re-polarization matrix $RGM_B$ is implemented by three stages of XOR logic gates in this example. In another embodiment, the number of stages of the logic gates of the re-polarization matrix $RGM_B$ may be arbitrary.

The polarization matrices $GM_H$, $GM_M$ and $GM_L$ respectively have $q_H$, $q_M$ and $q_L$ first input channels selected as the to-be-enhanced input channels. The reliability of the to-be-enhanced input channels may be improved through the re-polarization matrix $RGM_B$, wherein the re-polarization matrix $RGM_B$ includes $q_{rB}$ second input channels, and the number of extra bits in the polar code generated due to the re-polarization matrix $RGM_B$ is $q_B = q_{rB} - (q_H + q_M + q_L)$. In an embodiment, $q_{rB} = 2q_B$.

Figure 8A:
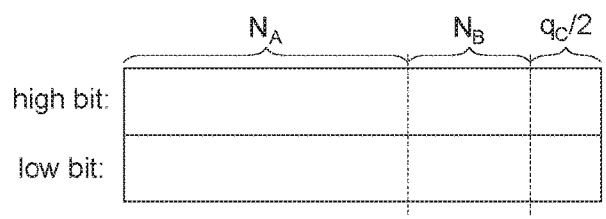
FIG. 8A illustrates a polar code structure according to an embodiment of the present disclosure.
Figure 8B:
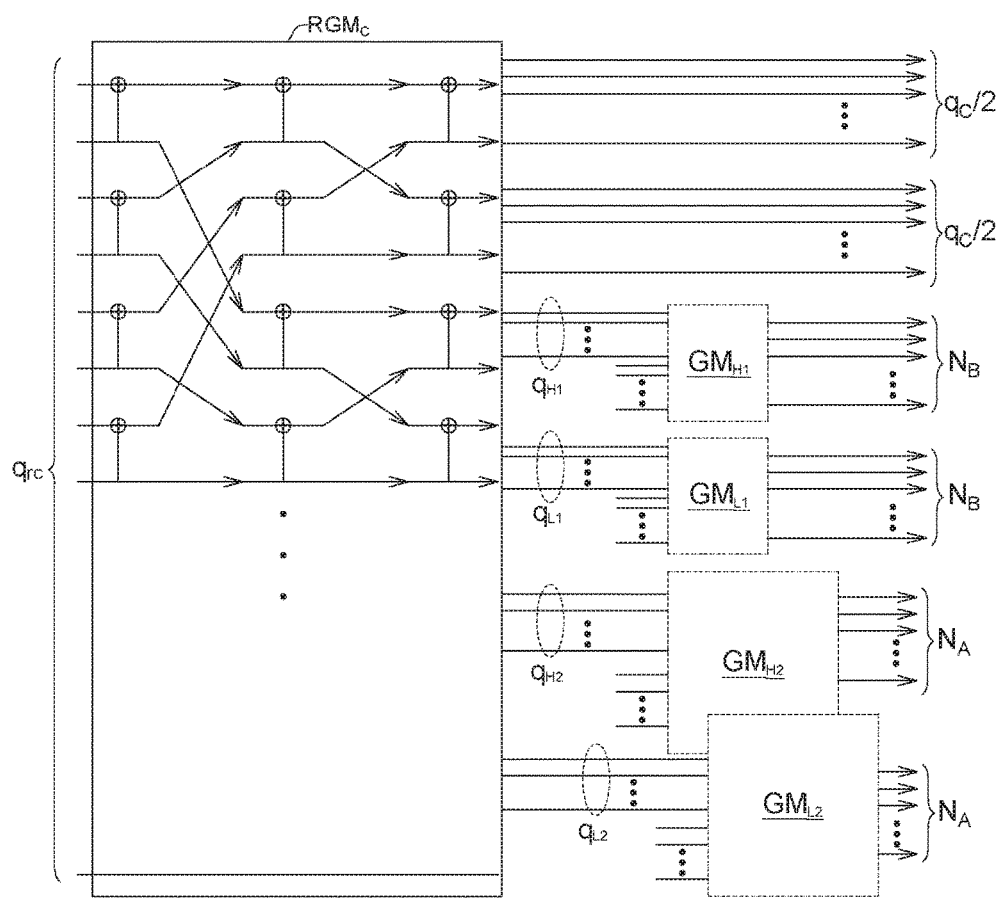
FIG. 8B illustrates the polarization transformation according to the embodiment of FIG. 8A.

Next, please refer to FIG. 8A and FIG. 8B. FIG. 8A illustrates a polar code structure according to an embodiment of the present disclosure. FIG. 8B illustrates the polarization transformation according to the embodiment of FIG. 8A.

According to the embodiment, the high bit data and the low bit data in the polar code respectively include $$N_A + N_B + \frac{q_C}{2}$$

bits. The polarization matrices $GM_{H1}$ and $GM_{H2}$ respectively provide $N_B$ and $N_A$ first output bits for the high bit data of the polar code. The polarization matrices $GM_{L1}$ and $GM_{L2}$ respectively provide $N_B$ and $N_A$ first output bits for the low bit data of the polar code, where $N_A$ is not equal to $N_B$. That is, the polarization matrices $GM_{H1}$ and $GM_{H2}$ (or $GM_{L1}$ and $GM_{L2}$) respectively provide two groups of output bits with different numbers of bits, wherein one group of output bits includes $N_B$ first output bits, and the other group of output bits includes $N_A$ first output bits.

In addition, the polarization matrices $GM_{H1}$, $GM_{H2}$, $GM_{L1}$, and $GM_{L2}$ have respectively $q_{H1}$, $q_{H2}$, $q_{L1}$, and $q_{L2}$ first output channels selected as to-be-enhanced input channels. The reliability of the to-be-enhanced input channels are enhanced through the re-polarization matrices $RGM_C$, wherein the re-polarization matrix $RGM_C$ includes $q_{rC}$ second input channels, and the number of extra bits in the polar code generated due to the re-polarization matrix $RGM_C$ is $q_C = q_{rC} - (q_{H1} + q_{H2} + q_{L1} + q_{L2})$. In an embodiment, $q_{rC} = 2q_C$.

In the above manner, a $$\left(2 \times \left(N_A + N_B + \frac{q_C}{2}\right), K\right)$$

polar code is realized, in which $$2 \times \left(N_A + N_B + \frac{q_C}{2}\right)$$

represents the code length of the polar code and K represents the number of information bits in the polar code. For example, $N_A = 4096$, $N_B = 512$, $q_C = 24$, and $K = 8192$.

It is noted that in the above various embodiments, the connection between the re-polarization matrix and the polarization matrices is not restricted to: the first half channels is responsible for transmitting the extra bits (e.g., the two sets of $q_C/2$ channels in FIG. 8B) and the second half channels consist of the to-be-enhanced input channels (e.g., the $q_{H1}$, $q_{H2}$, $q_{L1}$ and $q_{L2}$ channels of the polarization matrices in FIG. 8B). In some embodiments, the arrangement of the connection between the re-polarization matrix and the polarization matrices may not be so regular when the length of re-polarization is large.

In summary, the disclosure provides a polar code generating method, and an electronic device and a non-transitory computer-readable storage medium using the same. According to the embodiments of the present disclosure, the processor may establish a plurality of polarization matrices and perform repolarization on specific input bit channel(s) of the polarization matrices to improve the channel reliability. Further, extra output bit(s) may be generated during the repolarization, so that the code length of the polar code is not restricted to the power of 2, thereby reducing the complexity of system design.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A polar code generating method, executed by an electronic device comprising a processor, comprising:
   establishing a plurality of polarization matrices that receive a plurality of first input bits via a plurality of first input channels, the polarization matrices performing a first polar coding scheme on the first input bits and providing a plurality of first output bits on a plurality of first output channels;
   selecting at least one to-be-enhanced input channel from the first input channels of the polarization matrices;
   providing a re-polarization matrix that receives a plurality of second input bits via a plurality of second input channels, the re-polarization matrix performing a second polar coding scheme on the second input bits and providing a plurality of second output bits on a plurality of second output channels, wherein a part of the second output bits is used as the first output bit(s) on the at least one to-be-enhanced input channel; and
   providing a polar code that comprises the first output bits and a remaining part of the second output bits.

2. The polar code generating method according to claim 1, wherein the first output bits comprise a first group of output bits and a second group of output bits, the first group of output bits represents high bit data, the second group of output bits represents low bit data, and the polar code generating method further comprises:
   providing the first group of output bits by using a first polarization matrix of the polarization matrices; and providing the second group of output bits by using a second polarization matrix of the polarization matrices.

3. The polar code generating method according to claim 1, wherein the first output bits comprise a first group of output bits, a second group of output bits and a third group of output bits, the first group of output bits represents high bit data, the second group of output bits represents middle bit data and the third group of output bits represents low bit data, and the polar code generating method further comprises:

providing the first group of output bits by using a first polarization matrix of the polarization matrices;

providing the second group of output bits by using a second polarization matrix of the polarization matrices; and providing the third group of output bits by using a third polarization matrix of the polarization matrices.

4. The polar code generating method according to claim 1, wherein the first output bits comprise a first group of output bits and a second group of output bits, the number of bits of the first group of output bits is different from that of the second group of output bits, and the polar code generating method further comprises:

providing the first group of output bits by using a first polarization matrix of the polarization matrices; and providing the second group of output bits by using a second polarization matrix of the polarization matrices.

5. The polar code generating method according to claim 1, wherein the number of bits of the remaining part of the second output bits is the same as the number of channels of the at least one to-be-enhanced input channel.

6. The polar code generating method according to claim 1, wherein the number of bits of the remaining part of the second output bits is q, and the number of channels of the second input channels of the re-polarization matrix is 2q, where q is a positive integer.

7. The polar code generating method according to claim 1, wherein the remaining part of the second output bits is used as frozen bit(s).

8. A non-transitory computer-readable storage medium storing one or more instructions executable by a processor to cause an electronic device comprising the processor perform the polar code generating method as described in claim 1.

9. An electronic device, comprising:

a memory storing at least one instruction;

a processor coupled to the memory, the processor executing the at least one instruction to:

establish a plurality of polarization matrices that receive a plurality of first input bits via a plurality of first input channels, the polarization matrices performing a first polar coding scheme on the first input bits and providing a plurality of first output bits on a plurality of first output channels;

select at least one to-be-enhanced input channel from the first input channels of the polarization matrices;

provide a re-polarization matrix that receives a plurality of second input bits via a plurality of second input channels, the re-polarization matrix performing a second polar coding scheme on the second input bits and providing a plurality of second output bits on a plurality of second output channels, wherein a part of the second output bits is used as the first output bit(s) on the at least one to-be-enhanced input channel; and provide a polar code that comprises the first output bits and a remaining part of the second output bits.

10. The electronic device according to claim 9, wherein the first output bits comprise a first group of output bits and a second group of output bits, the first group of output bits represents high bit data, the second group of output bits represents low bit data, and the processor is further configured to:

provide the first group of output bits by using a first polarization matrix of the polarization matrices; and provide the second group of output bits by using a second polarization matrix of the polarization matrices.

11. The electronic device according to claim 9, wherein the first output bits comprise a first group of output bits, a second group of output bits and a third group of output bits, the first group of output bits represents high bit data, the second group of output bits represents middle bit data and the third group of output bits represents low bit data, and the processor is further configured to:

provide the first group of output bits by using a first polarization matrix of the polarization matrices;

provide the second group of output bits by using a second polarization matrix of the polarization matrices; and provide the third group of output bits by using a third polarization matrix of the polarization matrices.

12. The electronic device according to claim 9, wherein the first output bits comprise a first group of output bits and a second group of output bits, the number of bits of the first group of output bits is different from that of the second group of output bits, and the processor is further configured to:

provide the first group of output bits by using a first polarization matrix of the polarization matrices; and provide the second group of output bits by using a second polarization matrix of the polarization matrices.

13. The electronic device according to claim 9, wherein the number of bits of the remaining part of the second output bits is the same as the number of channels of the at least one to-be-enhanced input channel.

14. The electronic device according to claim 9, wherein the number of bits of the remaining part of the second output bits is q, and the number of channels of the second input channels of the re-polarization matrix is 2q, where q is a positive integer.

15. The electronic device according to claim 9, wherein the remaining part of the second output bits is used as frozen bit(s).

* * * * *